United States Patent
Brioschi

(10) Patent No.: US 10,338,378 B2
(45) Date of Patent: Jul. 2, 2019

(54) MIRROR GROUP, IN PARTICULAR FOR A PICOPROJECTOR, COMPRISING MICROMIRRORS MADE USING THE MEMS TECHNOLOGY

(71) Applicant: STMICROELECTRONICS S.R.L., Agrate Brianza (IT)

(72) Inventor: Roberto Brioschi, Sesto San Giovanni (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 306 days.

(21) Appl. No.: 15/264,446

(22) Filed: Sep. 13, 2016

(65) Prior Publication Data

US 2017/0235128 A1 Aug. 17, 2017

(30) Foreign Application Priority Data

Feb. 12, 2016 (IT) .......................... 102016000014709

(51) Int. Cl.
| | |
|---|---|
| *G02B 26/10* | (2006.01) |
| *B81B 7/00* | (2006.01) |
| *G02B 26/08* | (2006.01) |

(52) U.S. Cl.
CPC ............ *G02B 26/101* (2013.01); *B81B 7/008* (2013.01); *G02B 26/0833* (2013.01);
(Continued)

(58) Field of Classification Search
CPC ............ G02B 26/0841; G02B 26/105; G02B 26/085; G02B 26/101; G02B 26/0833; G02B 26/0858; G02B 7/1821; G02B 26/121; G02B 26/10; G02B 26/123; G02B 26/125; G02B 26/127; G02B 6/3518; G02B 23/2407; G02B 26/005; G02B 26/0816; G02B 26/0825; G02B 26/12; G02B 26/126; G02B 27/0031; G02B 5/09; G02B 6/3556; G02B 6/357; G02B 6/3584;
(Continued)

(56) References Cited

U.S. PATENT DOCUMENTS

| | | |
|---|---|---|
| 7,012,762 B2 | 3/2006 | Tseng et al. |
| 7,184,619 B2 | 2/2007 | Kazama et al. |

(Continued)

FOREIGN PATENT DOCUMENTS

| | | |
|---|---|---|
| CN | 1576924 A | 2/2005 |
| CN | 101079536 A | 11/2007 |

(Continued)

*Primary Examiner* — Collin X Beatty
*Assistant Examiner* — Grant A Gagnon
(74) *Attorney, Agent, or Firm* — Seed IP Law Group LLP

(57) ABSTRACT

The mirror group is formed by a monolithic frame bent along a bending line and including a first and a second supporting portions carrying, respectively, a first and a second chips forming two micromirrors made using MEMS technology. The first and second supporting portions are arranged on opposite sides of the bending line of the frame, angularly inclined with respect to each other. The mirror group is obtained by separating a shaped metal tape carrying a plurality of frames, having flexible electric connection elements. After attaching the chips, the frames are precut, bent along the bending line, and separated.

17 Claims, 5 Drawing Sheets

(52) U.S. Cl.
CPC .... *G02B 26/0841* (2013.01); *B81B 2201/042* (2013.01); *B81C 2203/07* (2013.01)

(58) Field of Classification Search
CPC ............ G02B 13/0005; G02B 19/0014; G02B 19/0057; G02B 21/002; G02B 21/0036; G02B 21/22; G02B 23/02; G02B 26/02; G02B 26/0808; G02B 26/0866; G02B 26/0875; G02B 26/0883; G02B 26/103; G02B 26/106; G02B 26/108; G02B 26/122; G02B 26/124; G02B 27/0037; G02B 27/1086; G02B 27/4227; G02B 27/4283; G02B 27/646; G02B 3/14; G02B 5/0858; G02B 5/124; G02B 6/266; G02B 6/3568; G02B 7/025; G02B 7/182; G02B 7/1827; G02B 7/183; B81B 2201/042; B81B 3/007; B81B 2203/058; B81B 2203/0109; B81B 2203/0181; B81B 3/0067; B81B 2201/0235; B81B 2201/033; B81B 2201/038; B81B 2203/0154; B81B 3/0021; B81B 3/004; B81B 3/0051
USPC ........................................................ 359/198
See application file for complete search history.

(56) References Cited

U.S. PATENT DOCUMENTS

| | | | |
|---|---|---|---|
| 7,591,679 | B2 | 9/2009 | Mori et al. |
| 7,817,331 | B2 | 10/2010 | Moidu |
| 2004/0165249 | A1* | 8/2004 | Aubuchon ......... G02B 26/0841 359/291 |
| 2004/0252501 | A1 | 12/2004 | Moriyama et al. |
| 2005/0013534 | A1 | 1/2005 | Kazama et al. |
| 2005/0254120 | A1 | 11/2005 | Zaczek et al. |
| 2009/0190201 | A1 | 7/2009 | Ohara |
| 2011/0234898 | A1 | 9/2011 | Goren |
| 2013/0100416 | A1 | 4/2013 | Shimatani et al. |

FOREIGN PATENT DOCUMENTS

| | | |
|---|---|---|
| CN | 101329446 A | 12/2008 |
| CN | 101532880 A | 9/2009 |
| DE | 102014208498 A1 | 11/2015 |
| JP | 2011-123245 A | 6/2011 |
| JP | 2014-142517 A | 8/2014 |
| TW | 200426810 A | 12/2004 |
| WO | 2010067354 A1 | 6/2010 |

\* cited by examiner

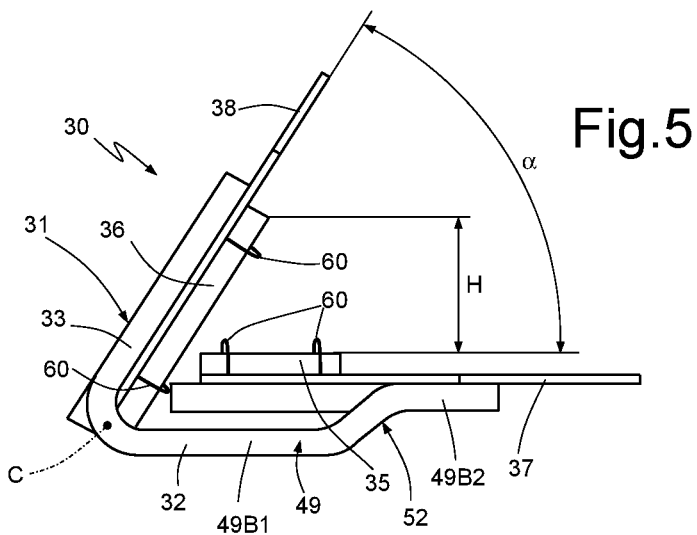
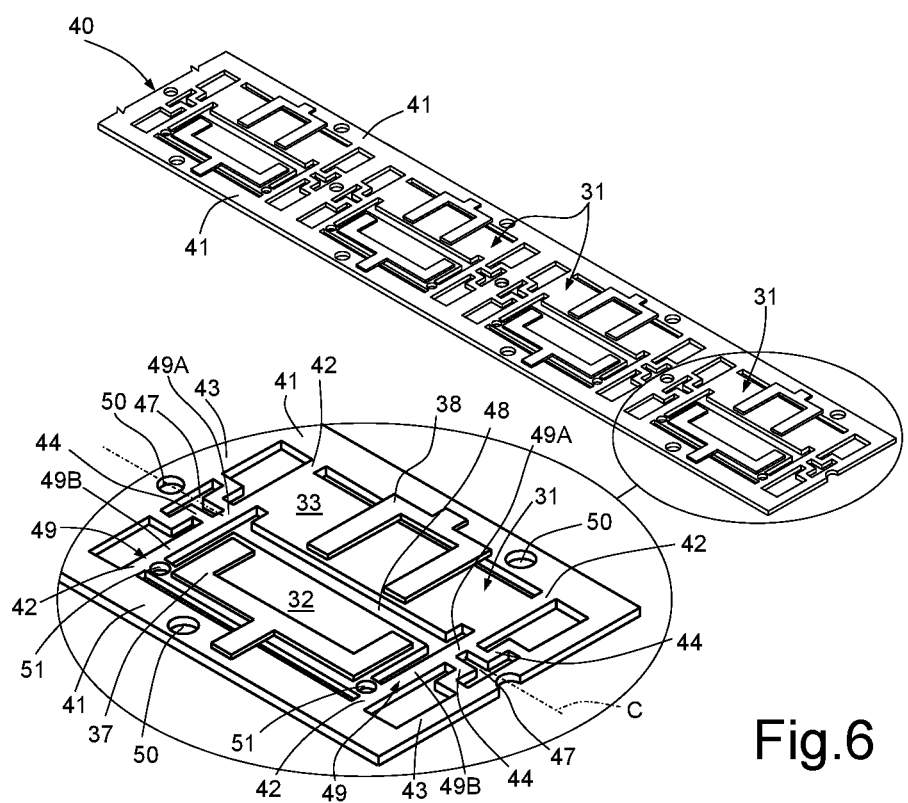

MIRROR GROUP, IN PARTICULAR FOR A PICOPROJECTOR, COMPRISING MICROMIRRORS MADE USING THE MEMS TECHNOLOGY

BACKGROUND

Technical Field

The present disclosure relates to a mirror package, in particular for a picoprojector, comprising micromirrors obtained using the MEMS technology.

Description of the Related Art

As is known, picoprojectors are devices of small dimensions which are able to project, on a wall or other surface, images, video clips, and other visual documents stored in small portable electronic equipment, such as cellphones, tablets, laptops, and the like. Furthermore, it has already been proposed to integrate such picoprojectors on the dashboard of motor vehicles, for example for projecting onto the windscreen information on satellite-navigation functions and other route or communication information.

In order to reduce the size, picoprojectors use MEMS micromirror systems, which are able to turn about two axes in order to perform a movement of scanning of a two-dimensional area. In particular, in some solutions, micromirror systems comprise a pair of MEMS mirrors driven for turning about two mutually perpendicular rotation axes.

For instance, FIG. 1 is a schematic illustration of a picoprojector wherein a light source 1, typically a laser source, generates a light beam 2 (generally formed by three monochromatic beams, one for each base color), which, through an optical system 3 shown only schematically, is deflected by a pair of MEMS mirrors 5, 6. The first MEMS mirror 5 may, for example, be a horizontal micromirror, rotating about a first axis A and generating a fast horizontal scan, and the second MEMS mirror 6 may, for example, be a vertical micromirror, rotating about a second axis B, transverse, in particular perpendicular, to the first axis A, and generating a slow vertical scan, typically of a sawtooth type. The combination of the movements of the two MEMS mirrors 5, 6 causes the light beam 2 to perform a complete two-dimensional scanning movement and, once projected on a projection display 7, to generate a two-dimensional image thereon. Such a system is described, for example, in WO 2010/067354, which also published as U.S. Pat. Pub. No. 2011/234898.

MEMS mirrors 5, 6 may be formed as shown in FIG. 2. Here, a chip 10 comprises a mirror element 11 having a reflecting surface 9 and suspended over a semiconductor substrate 8. The mirror element 11 is supported by a pair of arms 12, which extend from opposite sides of the mirror element 11 and define the rotation axis of the mirror element 11 (for example, rotation axis B of the vertical micromirror 6). The arms 12 are connected to a fixed peripheral portion 13 of the chip 10, which is fixed with respect to the substrate 8, via torsion springs 14 enabling rotation of the arms 12 about the axis B. The arms 12 are further coupled to a driving structure formed by actuation units 18 of an electrostatic type. Each actuation unit 18 comprises mobile electrodes 19 facing fixed electrodes 20.

In detail, the mobile electrodes 19 are fixed with respect to the arms 12 and are comb-fingered with respect to the fixed electrodes 20 for generating a capacitive coupling. The fixed electrodes 20 are carried by supporting regions 21, which are generally fixed with respect to the substrate 8 of the chip 10. By virtue of the arrangement of the electrodes 19, 20, the driving structure is also defined as "comb-drive structure".

By applying appropriate voltages between the mobile electrodes 19 and the fixed electrodes 20, it is possible to generate attraction/repulsion forces between them and cause rotation of the mobile electrodes 19 with respect to the fixed electrodes 20, rotation of the arms 12 about axis B, and thus the corresponding controlled rotation of the mirror element 11.

Currently, MEMS mirrors 5, 6 are manually mounted in a picoprojector, each already fixed to a respective support. For instance, FIG. 3 shows a mirror package 24 wherein a chip, designated again by 10, is fixedly coupled to a support 25, generally of metal. An electric connection structure 26, for example a flexible printed circuit (FPC) carrying electric connection lines 27, is also fixedly coupled to the support 25. The electric connection lines 27 are connected to the chip 10 via electric wires 28, in a per se known manner.

During assembly in a portable electronic apparatus, an operator picks up two mirror chips, one for a horizontal MEMS mirror and the other for a vertical MEMS mirror, and using a jig and microactuators in a specific apparatus, positions the two chips to mate them, until they are brought into the desired alignment. Next, the operator applies a curable glue using ultraviolet light, and the two mirror chips are fixed in the operative position.

This type of assembly process is slow, difficult, and sensibly error-prone. It follows that, with this method, the throughput and yield of correctly mounted pieces are not optimal.

BRIEF SUMMARY

According to one or more embodiments of the present disclosure, a mirror package, a tape, and a method for assembly of the mirror package are provided.

In one embodiment, two micromirrors, horizontal and vertical, are assembled on a same metal frame and electrically couple by wire to a respective electric connection element (flexible printed circuit) already fixed to the frame. Then, the frame is bent so as to position the two micromirrors with the desired mutual angular arrangement. Bending may be carried out automatically, without human intervention, using a forming press similar to those used in the semiconductor industry for shaping connection conductors in packages of standard integrated circuits. The frame may be carried by a tape, together with a plurality of similar frames, and the individual frames may be separated after a single bending step.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein:

FIG. 5 is a side view of the mirror package of FIG. 4; and

FIGS. 6-10 show, in perspective view, a tape comprising a plurality of frames for manufacturing micromirror packages in successive assembly steps.

DETAILED DESCRIPTION

Figure 4:
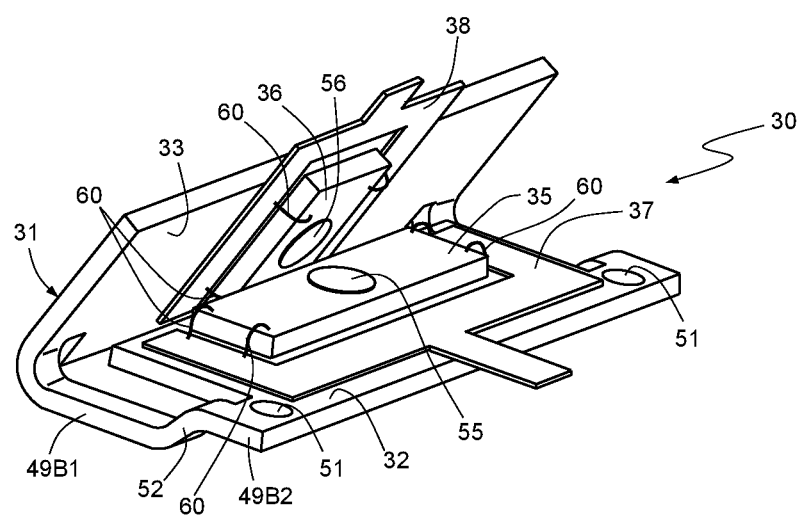
FIG. 4 is a perspective view of the present mirror package.

FIGS. 4 and 5 show a mirror package 30 designed to be mounted in a portable electronic apparatus (not shown).

The mirror package 30 comprises a frame 31 of rigid material bent into a V-shape for forming a first supporting portion 32, carrying a first chip 35, and a second supporting portion 33, carrying a second chip 36.

The frame 31 is in general of sheet metal, typically aluminum, for example with a thickness of about 0.5 mm so as to enable bending thereof in a purposely designed machine (as explained in detail hereinafter) but for have, at the same time, a sufficient stiffness degree to prevent any deformation during handling and a sufficient planarity of the supporting portions 32, 33 for precise positioning the chips 35, 36.

The first chip 35 is here, for example, a vertical MEMS mirror, and the second chip 36 is here, for example, a horizontal MEMS mirror. The chips 35, 36 are fixed to the respective supporting portions 32, 33 via a glue, for example a bi-adhesive layer (so called die attach film), standard in the semiconductor industry.

Figure 3:
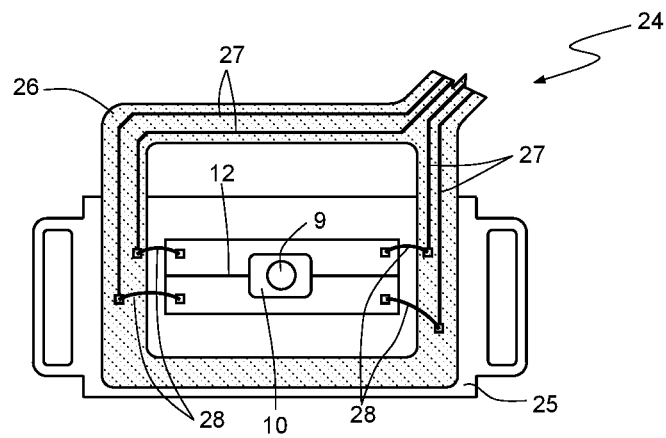
FIG. 3 is a top plan view of a micromirror mounted on a support prior to assembly in an electronic apparatus.

Furthermore, the frame 31 carries two electric connection structures 37, 38, one for each chip 35, 36, formed, for example, as sticky printed circuits, so called flexible printed circuits (FPCs) of a known type, embedding electric connection lines (not visible here) similar to the electric connection lines 27 of FIG. 3. The electric connection structures 37, 38 are coupled to the chips 35, 36 via wires 60.

The first supporting portion 32 is connected to the second supporting portion 33 via connection arms 49 having S-shaped bent portions 52, as described in detail below with reference to FIG. 8.

The frame 31 is obtained via shearing and bending of a plane metal sheet, as described hereinafter with reference to FIGS. 6-10. In particular, the frame 31 is bent about a median virtual line designated by C in FIG. 5 so as to obtain a preset angle α, for example 60°, between the two supporting portions 32, 33, and a preset height H, for example 2.6 mm, between the edge of the second chip 36 which is far with respect to the bending line C and the upper surface of the first chip 35. In fact, bending determines a deformed area wider than the bending line. For simplicity, in the following, the median virtual line referred to above will be defined as a bending line C, and the deformed area will be referred to as a bending zone.

Figure 1:
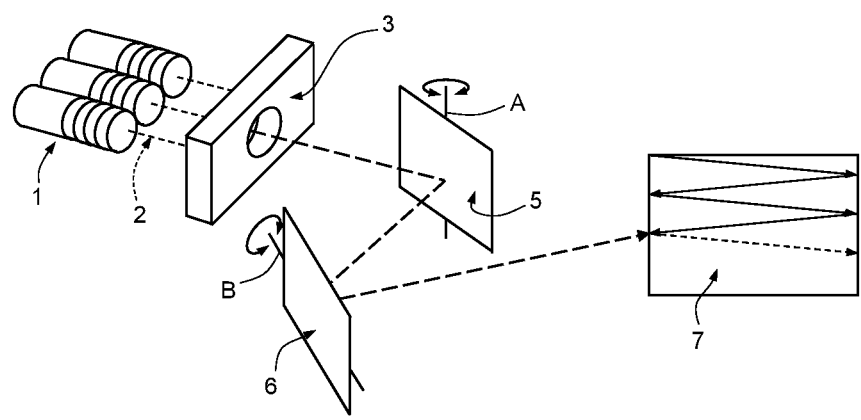
FIG. 1 is a schematic perspective view of a picoprojector.
Figure 2:
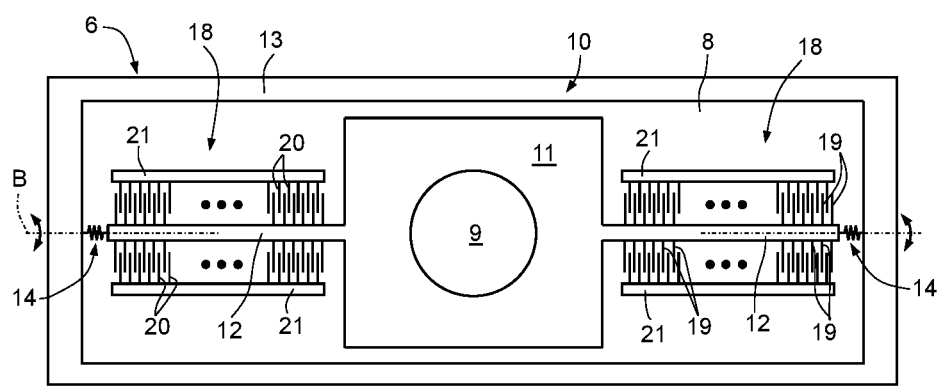
FIG. 2 is a schematic illustration of an embodiment of a micromirror of FIG. 1.

In this way, reflecting surfaces 55, 56 of the chips 35, 36 correctly face one another and are in the correct position to be able to deflect a light ray, as in the picoprojector of FIG. 1.

With reference to FIG. 6, a tape 40 of sheet metal, for example aluminum, is stamped so as to form two strips 41, forming two longitudinal edges of tape 40, and a plurality of frames 31, arranged alongside one another in the longitudinal direction of the tape 40, between the strips 41. Each frame 31 has a roughly rectangular shape and is supported by the strips 41 at a plurality of peripheral links 42, here four for each frame 31, arranged at the corners of the roughly rectangular shape, and by supporting arms 43. Each supporting arm 43 extends transversely to the strips 41, has ends connected to the two strips 41 and is arranged between two adjacent frames 31. In addition, each supporting arm 43 is connected to the two adjacent frames 31, arranged on the two sides thereof, via median links 44 that extend between a median portion of the supporting arms 43 and a median portion of the frames 31.

In detail, the median links 44 are formed by S-shaped stretches of metal sheet, arranged in couple symmetrically with respect to the bending axis C so as to define a slit 47 between them, the slit having a longitudinal stretch aligned with the bending axis C.

In each frame 31, the supporting portions 32, 33 are arranged on opposite sides with respect to the bending axis C and are separated from each other by an opening 48 extending in a longitudinal direction of the tape 40, along bending axis C.

The supporting portions 32, 33 of each frame 31 have a generally rectangular shape and are connected to one another via connection portions, extending transversely with respect to the tape 40 and across the bending line C. In the embodiment shown, each connection portion comprises a connection arm 49 having a first end connected to the first supporting portion 32 in proximity of a respective outer corner of this first supporting portion 32, close to the strip 41 that is adjacent thereto, and a second end connected to the second supporting portion 33 in proximity of a respective inner corner of the second supporting portion 33, close to bending axis C. The median links 44 are connected to the frames 31 at the connection arms 49.

In this way, each connection arm 49 forms a bending zone 49A, as clarified hereinafter, and has an arm portion 49B extending along a transverse side of the respective first supporting portion 32, between the bending zone 49A and the adjacent outer corner of the first supporting portion 32.

The tape 40 further carries the electric connection elements 37, 38, fixed to the respective supporting portions 32, 33 in a known way. The electric connection elements are here U-shaped.

First alignment holes 50 are formed along the strips 41, and each frame 31 has second alignment holes 51, for example near the ends of the connection arms 49 for coupling to the first supporting portions 32.

Figure 7:
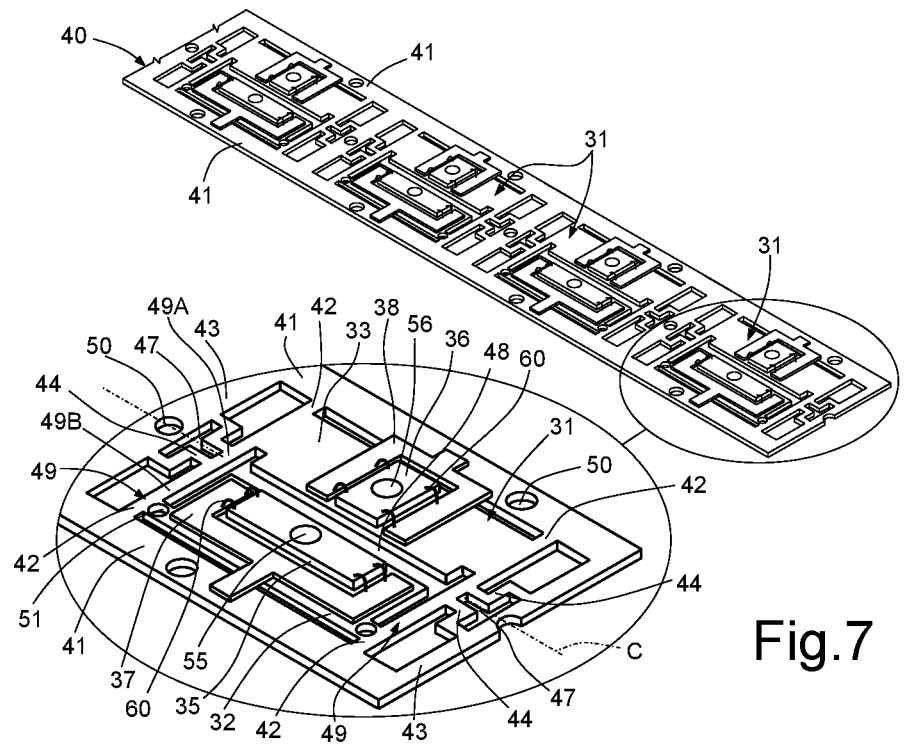

In FIG. 7, the first and second chips 35, 36 are attached to the respective supporting portions 32, 33 in a known way, for example via a die attach film so as to expose the respective reflecting surfaces 55, 56. Then, in a known way, electric connection wires 60 are soldered for electrically connecting the chips 35, 36 to the respective electric connection elements 37, 38.

Figure 8:
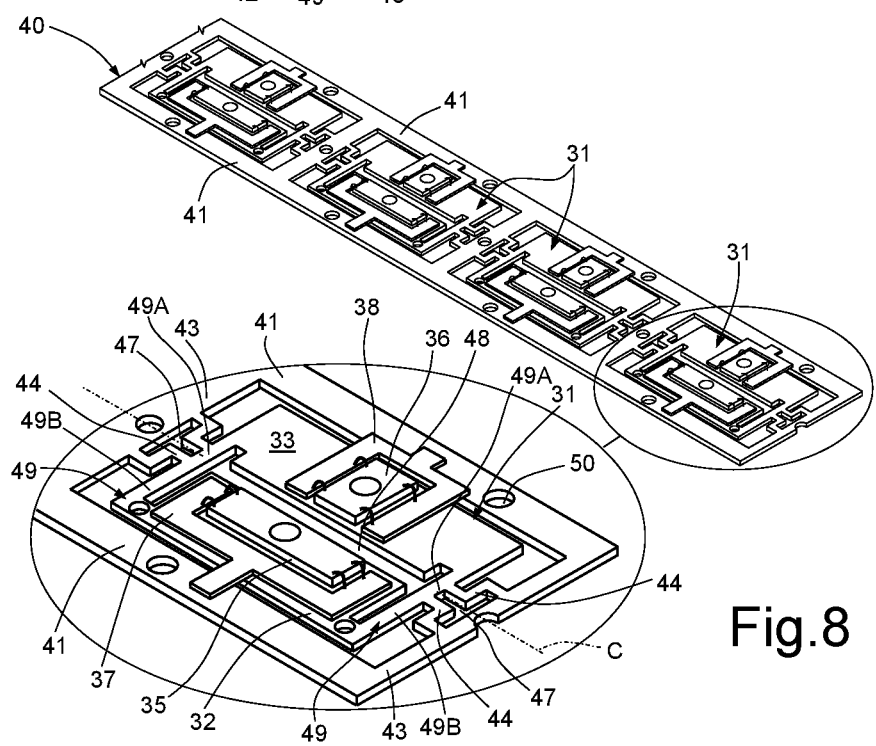

With reference to FIG. 8, the tape 40 is precut, for removing the peripheral links 42, using a trimming tool (not shown) of a standard type used in packaging integrated circuit, for example for trimming pins of lead-frames. In this way, each frame 31 is supported by the strips 41 through the supporting arms 43 and the median links 44.

Figure 9:
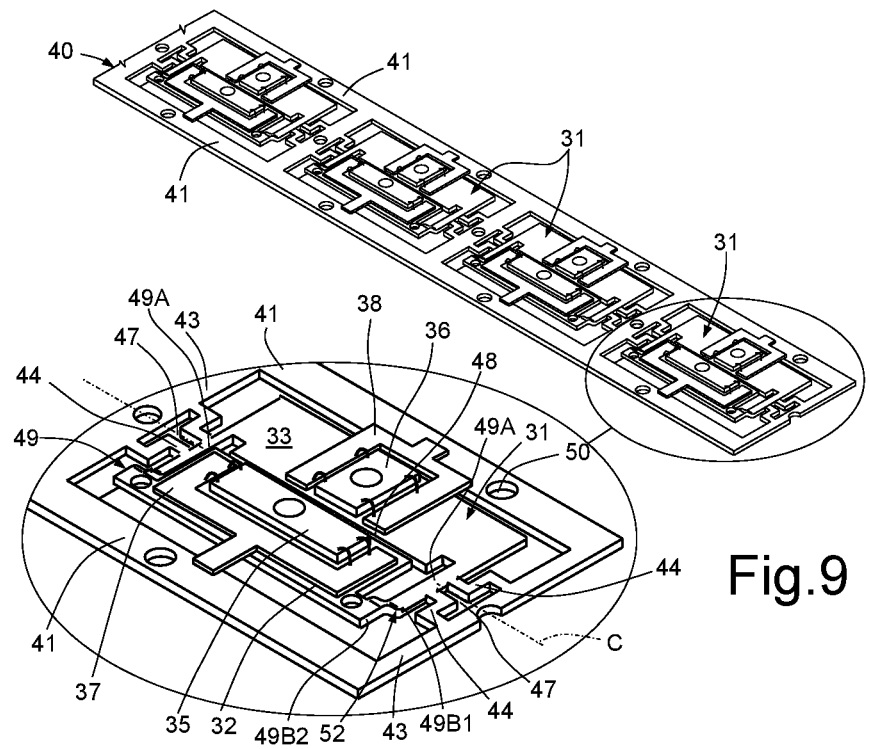

With reference to FIG. 9, the stretches 49B of all the connection arms 49 are subjected to a shaping step, using a tool (not shown), of a standard type used in packaging integrated circuits, for example for bending pins of lead-frames, for forming, in each connection arm 49, a respective S-shaped bent portion 52 and arranged along the arm portion 49B, that is thus no longer planar. In particular, each connection arm 49 bends so that a portion of each connection arm is in a different plane from the remaining portion of the connection arm. In one embodiment, an end of each connection arm 49 is in a different plane from the remaining portion of the connection arm.

In particular, in this way, a first arm stretch 49B1 connected to the bending zone 49A and a second arm stretch 49B2 connected to the first supporting portion 32 are obtained (see also FIG. 4). Furthermore, the second arm stretches 49B2 and the first supporting portions 32 connected thereto are no longer co-planar with the rest of the tape 40, in particular with the second supporting portions 33, and the first chips 35 are raised and close to the second chips of the frame 31.

Figure 10:
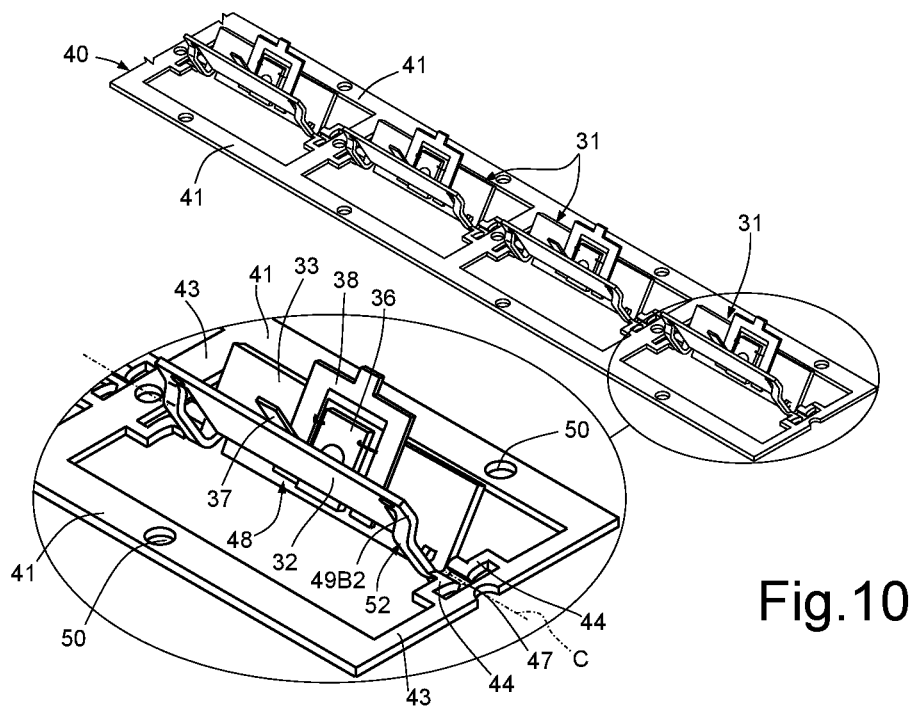

With reference to FIG. 10, the frames 31 are bent along the bending line C. To this end, a shaping press is used for bending the individual frames 31, still fixed to the strips 41 through the supporting arms 43 and the median links 44, so as to bring the two chips 35, 36 into the desired mutual angular and spatial position. In this step, bending is simplified by the fact that the bending zone of the frames 31 is formed by the connection arms 49, having a width (in the longitudinal direction of the tape 40) smaller than the respective frames 31, by virtue of the presence of the openings 48 and the slits 47. In this step, the median links 44 undergo deformation, by twisting, by virtue of their small section. In this way, bending along the bending line C is obtained easily, without any risk of incorrect bending in other parts of the frames 31.

The individual frames 31 are separated, by cutting the median links 44 in proximity of the connection arms 49, to obtain a plurality of mirror packages 30, shown in FIGS. 4 and 5. These may then be dispatched for their final assembly and easily and automatically mounted, also due to the presence of the second alignment holes 51, without requiring complex and delicate operations of manual assembly.

The mirror packages described herein have numerous advantages.

In particular, in one or more embodiments the mirror packages may be supplied already complete with the horizontal micromirror and the vertical micromirror arranged in the desired mutual angular and spatial position for assembly in electronic apparatuses. In this way, assembly may be carried out automatically by pick-and-place machines for placing the chips on the tape, reducing assembly costs and risks of erroneous positioning, and thus increasing the yield.

In some embodiments, the process of assembling the mirror packages in the electronic apparatuses may be carried out using automatic machines, without any or minimal human intervention, thus reducing the costs and increasing the productivity.

Furthermore to the S-shaped bent portion 52 of the connection arms 49, the first chip 35 may be brought spatially very close to the second chip 36, for a same bending angle α, thus reducing the dimensions of the corresponding first supporting portion 32. In this way, the tape 40 has a smaller width (in the transverse direction), enabling a reduction of material and of storage space, and thus a reduction of the associated costs.

Finally, it is clear that modifications and variations may be made to the mirror package, to the tape, and to the assembling method described and illustrated herein, without thereby departing from the scope of the present disclosure.

For instance, the bending lines C could be transverse instead of longitudinal, and the first and second supporting portions 32, 33 of each frame 31 could be longitudinally aligned with respect to the tape 40.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A package comprising:
   a first chip of semiconductor material including a first micromirror;
   a second chip of semiconductor material including a second micromirror; and
   a frame bent along a bending line, the frame including a first supporting portion and a second supporting portion, the first chip coupled to the first supporting portion and the second chip coupled to the second supporting portion, the first and second supporting portions arranged on opposite sides of the bending line of the frame and arranged angularly inclined with respect to each other, wherein the first micromirror is positioned to reflect a light beam at the second micromirror.

2. The package according to claim 1, comprising first and second flexible electric connection elements coupled to the first and second supporting portions, respectively, the first and second chips electrically coupled to the first and second supporting portions, respectively.

3. The package according to claim 1, wherein the first and second supporting portions are coupled to each other by a pair of connection portions, the pair of connection portions being bent along the bending line.

4. The package according to claim 3, wherein the first and second supporting portions have a generally rectangular shape.

5. The package according to claim 3, wherein each one of the pair of connection portions comprise a connection arm having a first end fixedly coupled to the first supporting portion and a second end fixedly coupled to the second supporting portion.

6. The package according to claim 5, wherein each one of the pair of connection arms have an S-shaped bent portion arranged between the bending line and the first end and defining a first arm stretch coupled to the bending zone and a second arm stretch coupled to the first supporting portion, the first supporting portion and the second arm stretch being on a different plane than the first stretch of the connection arms.

7. The package according to claim 5, comprising an opening between the first and second supporting portions along the bending line.

8. A sheet metal tape for assembling integrated micromirrors, the sheet metal tape comprising:
   a pair of longitudinal strips arranged parallel to each other at a first distance;
   a plurality of frames arranged alongside each other and between the longitudinal strips; and
   peripheral link elements arranged between the longitudinal strips and the frames,
   wherein each frame of the plurality of frames is monolithic with the longitudinal strips and the peripheral link elements and has a first supporting portion and a second supporting portion for supporting respective integrated micromirror chips, the first and second supporting portions being arranged on opposite sides of a bending line of the frame, the plurality of frames being configured to be bent along the bending line such that a first group of the respective integrated micromirror chips are positioned to reflect light at a second group of the respective micromirror chips.

9. The sheet metal element according to claim 8, further comprising a plurality of supporting arms and a plurality of median link elements, each of the plurality of supporting arms being monolithic with the frames, extending in a transverse direction with respect to the longitudinal strips, having ends fixedly coupled to the longitudinal strips, and arranged between two adjacent frames of the plurality of frames; and each of the plurality of median link elements being arranged between a supporting arm and an adjacent frame of the plurality of frames.

10. The sheet metal element according to claim 9, wherein the plurality of median link elements are arranged in pairs on two opposite sides of the bending line of each frame and form longitudinal slits aligned to the bending line, the first and second supporting portions of each frame being separated from each other by a respective opening extending between the first and second supporting portions of each frame along the bending line.

11. A method for assembling a micromirror package comprising:
coupling a first chip of semiconductor material integrating a first micromirror to a first supporting portion of a frame;
coupling a second chip of semiconductor material integrating a second micromirror to a second supporting portion of the frame; and
bending the frame along a bending line so that the first and second supporting portions are arranged angularly inclined with respect to one another, the bending of the frame positioning the second micromirror to receive light reflected from the first micromirror.

12. The method according to claim 11, wherein the step of bending of the frame is carried out in a press.

13. The method according to claim 11, wherein the frame is a frame of a plurality of adjacent frames carried by a pair of longitudinal strips extending parallel to one another, the method comprising the step of bending the plurality of adjacent frames along respective bending lines and separating the plurality of adjacent frames from the longitudinal strips and from each other.

14. The method according to claim 11, wherein the frame has a pair of connection arms having a first end fixedly coupled to the first supporting portion and a second end fixedly coupled to the second supporting portion, the method comprising bending the connection arms in an area arranged between the bending line and the first end, and forming an S-shaped bent portion.

15. The method according to claim 14, wherein the step of bending the connection arms occurs before the step of bending the frame along the bending line.

16. The method according to claim 11, comprising coupling flexible electric connection elements to the first and second supporting portion, respectively, the method comprising the step of electrically coupling the first and second chips to the first and second flexible electric connection elements, respectively, via electric wires.

17. The method according to claim 16, wherein the step of electrically coupling the first and second chips to the first and second flexible electric connection elements, respectively, occurs before the step of bending the frame.

* * * * *